United States Patent
Suzuki et al.

(10) Patent No.: US 6,325,269 B1
(45) Date of Patent: Dec. 4, 2001

(54) WIRE BONDING CAPILLARY

(75) Inventors: Takesi Suzuki; Mamoru Sakurai, both of Kita-kyushu; Minoru Torihata, Musashi Murayama; Tatsunari Mii, Tachikawa, all of (JP)

(73) Assignee: Toto Ltd., Fukuoka (JP)

( * ) Notice: Subject to any disclaimer, the term of this patent is extended or adjusted under 35 U.S.C. 154(b) by 0 days.

(21) Appl. No.: 09/582,050

(22) PCT Filed: Dec. 16, 1998

(86) PCT No.: PCT/JP98/05690

§ 371 Date: Aug. 16, 2000

§ 102(e) Date: Aug. 16, 2000

(87) PCT Pub. No.: WO99/33100

PCT Pub. Date: Jul. 1, 1999

(30) Foreign Application Priority Data

Dec. 19, 1997 (JP) ..................................................... 9-364387

(51) Int. Cl.[7] ............................. B23K 37/00; B23K 1/06
(52) U.S. Cl. ................................ 228/4.5; 228/1.1; 228/4.1
(58) Field of Search ............................... 228/4.5, 1.1, 4.1, 228/45, 110.1, 180.1, 256, 904

(56) References Cited

U.S. PATENT DOCUMENTS

| | | | |
|---|---|---|---|
| 4,415,115 | * | 11/1983 | James ..................................... 228/170 |
| 4,886,200 | * | 12/1989 | Tsumura ................................. 228/1.1 |
| 4,911,350 | * | 3/1990 | Araki et al. ............................ 228/110 |
| 5,421,503 | * | 6/1995 | Perlberg et al. ........................ 228/4.5 |
| 5,437,405 | * | 8/1995 | Asanasavest ........................... 228/180.5 |
| 5,558,270 | * | 9/1996 | Nachon et al. ......................... 228/180.5 |
| 5,662,261 | * | 9/1997 | Fogal ..................................... 228/4.5 |
| 5,839,640 | * | 11/1998 | Kinnaird ................................ 228/4.5 |
| 5,871,141 | * | 2/1999 | Hadar et al. ........................... 228/180.5 |
| 5,884,830 | * | 3/1999 | Yamazaki et al. ...................... 228/1.1 |
| 5,906,308 | * | 5/1999 | Yamazaki et al. ...................... 228/4.5 |
| 5,931,368 | * | 8/1999 | Hadar et al. ........................... 228/4.5 |
| 6,041,995 | * | 3/2000 | Takahashi et al. ..................... 228/164 |

FOREIGN PATENT DOCUMENTS

| | | |
|---|---|---|
| 59191338 | 10/1984 | (JP) . |
| 3094641 | 4/1988 | (JP) . |
| 1-42349 | 12/1989 | (JP) . |
| 4069943 | 3/1992 | (JP) . |
| 5267382 | 10/1993 | (JP) . |
| 8162489 | 6/1996 | (JP) . |

\* cited by examiner

*Primary Examiner*—M. Alexandra Elve
*Assistant Examiner*—Zidia Pittman
(74) *Attorney, Agent, or Firm*—Jones, Day, Reavis & Pogue

(57) ABSTRACT

A wire bonding capillary (1), which is able to decrease wire extraction resistance and suitable for a long and low loop wire bonding process, comprises a through bore (5) for feeding a bonding wire, a funnel-shaped bore (3) for guiding the wire to the through bore, and a tapered portion (11) formed at an exit of the through bore. The through bore length is between 0.2 and 1.5 times the through bore diameter. The tapered portion is tapered in two steps.

13 Claims, 4 Drawing Sheets though bore for feeding a bonding wire, a funnel-shaped bore for guiding the wire to the through bore, and a chamfer formed at an exit of the through bore, wherein the through bore is formed at the smallest diametered portion in each wire passage of a capillary and the bore has a length less than 1.5 times the through bore diameter.

WIRE BONDING CAPILLARY

TECHNICAL FIELD

The present invention relates to a capillary for bonding wires between a semiconductor chip and a leadframe, and the like. Particularly, it relates to an improved wire bonding capillary, which is capable of decreasing wire slide resistance (extraction resistance) and suitably applied for a long and low loop wire bonding process.

BACKGROUND ART

A wire bonding capillary is a tube made of ceramics, which is mounted to a tip of a wire-feeding portion of a wire bonding apparatus. In general, each wire bonding capillary has a through bore for feeding a bonding wire, a funnel-shaped bore for guiding the wire to the through bore, and a chamfer formed at an exit of the through bore. Here, the through bore is formed at the smallest diametered portion in each wire passage of a capillary. The chamfer is generally formed to taper having an opening angle of between 45° and 60° ( shown θ1, θ2 in FIG. 1). Further, the corner between the chamfer and the through bore may be grounded to be round.

An embodiment of Japanese Unexamined Patent Publication No. Shou 59(1984)-191338 discloses the following wire bonding capillary. The capillary, according to the embodiment, has a through bore whose diameter (corresponding to d1 in FIG. 1) is 43 μm and a chamfer whose opening angles( corresponding to θ1, θ2 in FIG. 1) are 45° and 15°.

In Japanese Examined Utility Model Publication No. Hei 1(1989)-42349, the following wire bonding capillary is disclosed as a preferable one; he through bore diameter (corresponding to d1 in FIG. 1) is the wire diameter plus 8–12 μm; each of the opening angles of the chamfers (corresponding to θ1, θ2 in FIG. 1) is 40–50° and 10–20°, respectively; and the chamfer length ( corresponding to h1 in FIG. 1) is the wire diameter×0.7–1.5.

However, none of the two prior arts discloses the through bore length and a technology trend for long and low loop wire bonding processes, as described below, and its associated problems.

Recently, in VLSI (Very Large Scale Integration) and the like, miniaturization of chips and multiplication of pins for high integration purposes have been advanced further, so that a need for long and low loop wire bonding processes becomes keen.

When a conventional wire bonding tool is used for carrying out a long and low loop wire bonding process, it is necessary to feed, from the through bore, the wire with a twice length longer than usual. Accordingly, the wire tends to twine and thus to yield a dispersion of the loop height due to sagging and excessive tautening. The sagging of the loop causes the wires to contact each other to lead to a short circuit failure. And also, the excessive tautening of the loop applies excess stress to a neck portion of a bonded ball to lead to a disconnection failure. Both failures are fatal defect on the wire bonding process and have to be completely dismissed.

In view of the above problems, the object of the present invention is to provide a wire bonding capillary, which is suitable for a long and low loop wire bonding process and is able to lower wire slide resistance.

DISCLOSURE OF THE INVENTION

In order to solve the above-mentioned problems, a wire bonding capillary according to the present invention has a through bore for feeding a bonding wire, a funnel-shaped bore for guiding the wire to the through bore, and a chamfer formed at an exit of the through bore, wherein the through bore is formed at the smallest diametered portion in each wire passage of a capillary and the bore has a length less than 1.5 times the through bore diameter.

As a result of experiment as mentioned below, it is fundamentally proven that the smaller the slide resistance of a wire, the shorter the length of the through bore. The through bore diameter, for the requirement of the positioning accuracy of the wire, is determined by adding some minute clearance to the through bore diameter, and the wire has to be drawn through a narrow place so that the slide resistance is high. Accordingly, it is desirable that the slide resistance will be lowered by making the through bore length as short as possible. From this view point, the through bore length is preferably less than 0.5 times the through bore diameter.

In the wire bonding capillary according to the present invention, it is preferable that a chamfer is so formed to widen an opening angle thereof toward an exit of the through bore. When a long and low loop wire is arranged, an angle between the axis of the capillary and the wire tends to get bigger so that the wire will sharply bent at the tip of the capillary to produce a large resistance against pulling out the wire here.

Therefore, at the tip of the capillary, the chamfer is formed to widen the opening angle thereof toward the exit of the through bore, whereby the wire can be smoothly introduced while being bent. Consequently, the resistance will be reduced.

Figure 1:
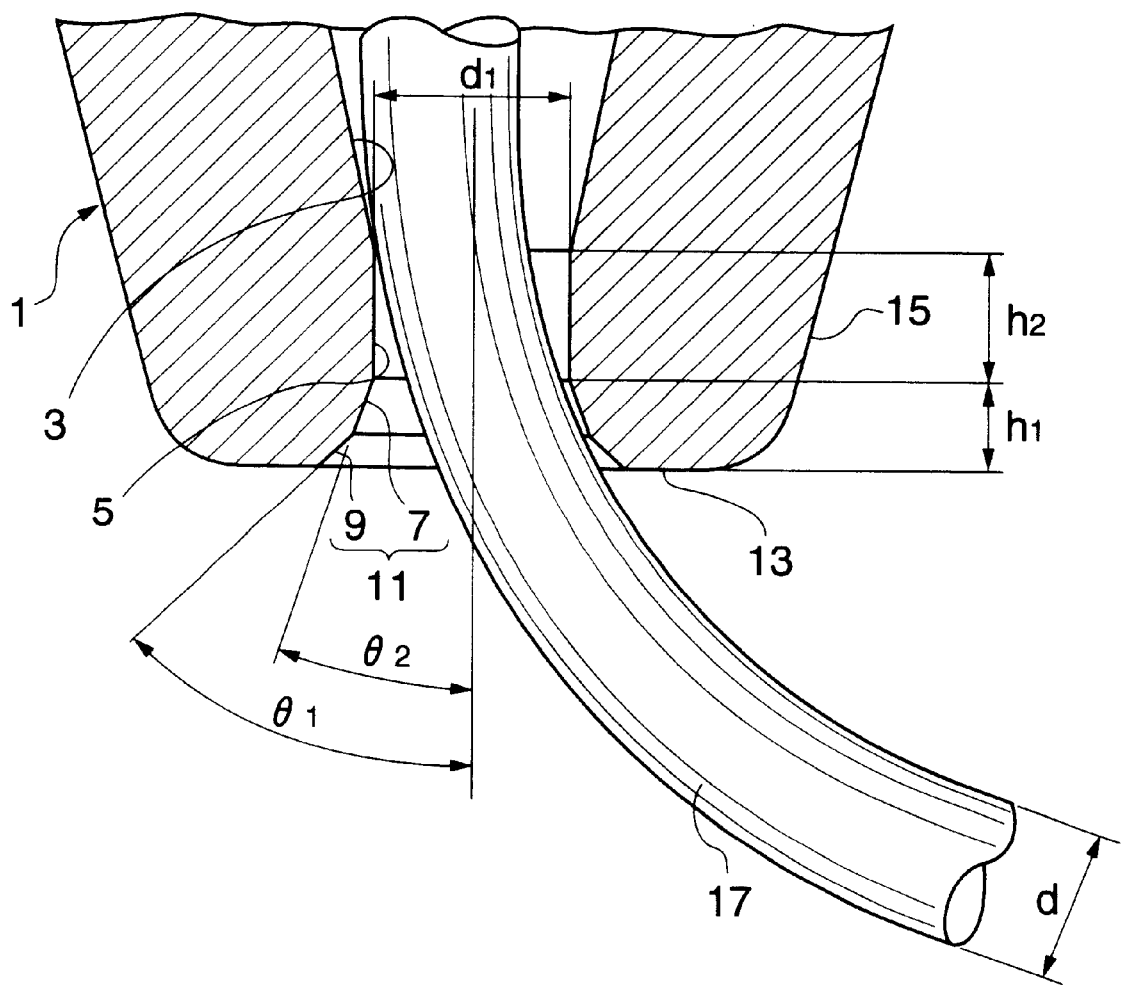
FIG. 1 shows a sectional view of a wire bonding capillary tip according to one embodiment of the present invention.

The reference numerals in the drawings are described as follows:

1 a wire bonding capillary
3 a funnel-shaped bore
5 a wire through bore
7 a first chamfer
9 a second chamfer
11 a tapered portion
15 outer surface
17 a wire

THE PREFERRED EMBODIMENT FOR CARRYING OUT THE INVENTION

Referring to the attached drawings, the detailed embodiments of the present invention will be set forth.

FIG. 1 shows a sectional view of a wire bonding capillary tip according to one embodiment of the present invention.

A capillary 1 is a tube made of a ceramic sintered body. An outer surface 15 of the capillary 1 has a conic surface, tapered thinner toward the tip( toward a lower direction in FIG. 1).

The capillary 1 has a funnel-shaped bore 3, a wire through bore 5 and a tapered portion 11, from the top to the bottom of FIG. 1, respectively at the inside thereof.

The funnel-shaped bore 3 is a bore that leads a wire 17 to the through bore 5. The through bore 5 is a straight and narrow bore as to locate the wire 17 to a certain position.

A chamfer 7 is a portion at which the wire, fed from the capillary 1 to a slantly downward direction, bends. In the capillary 1 of this embodiment, the tapered portion 11 is so formed to be tapered in two steps and has the first chamfer 7 at the through bore side and a second chamfer 9 at the exit side. Of the opening angles of both chamfers (the angle between the axis of the capillary and each of the chamfers, θ1, θ2 in FIG. 1), the angle at the exit side is larger. The numerical value of the angle is described later.

By this structure, it is accomplished that stress at the wire bent portion can be reduced, whereby the wire can be fed smoothly.

Next, the experimental examples that were carried out in order to optimize the angle and size of each portion will be explained.

Figure 2:
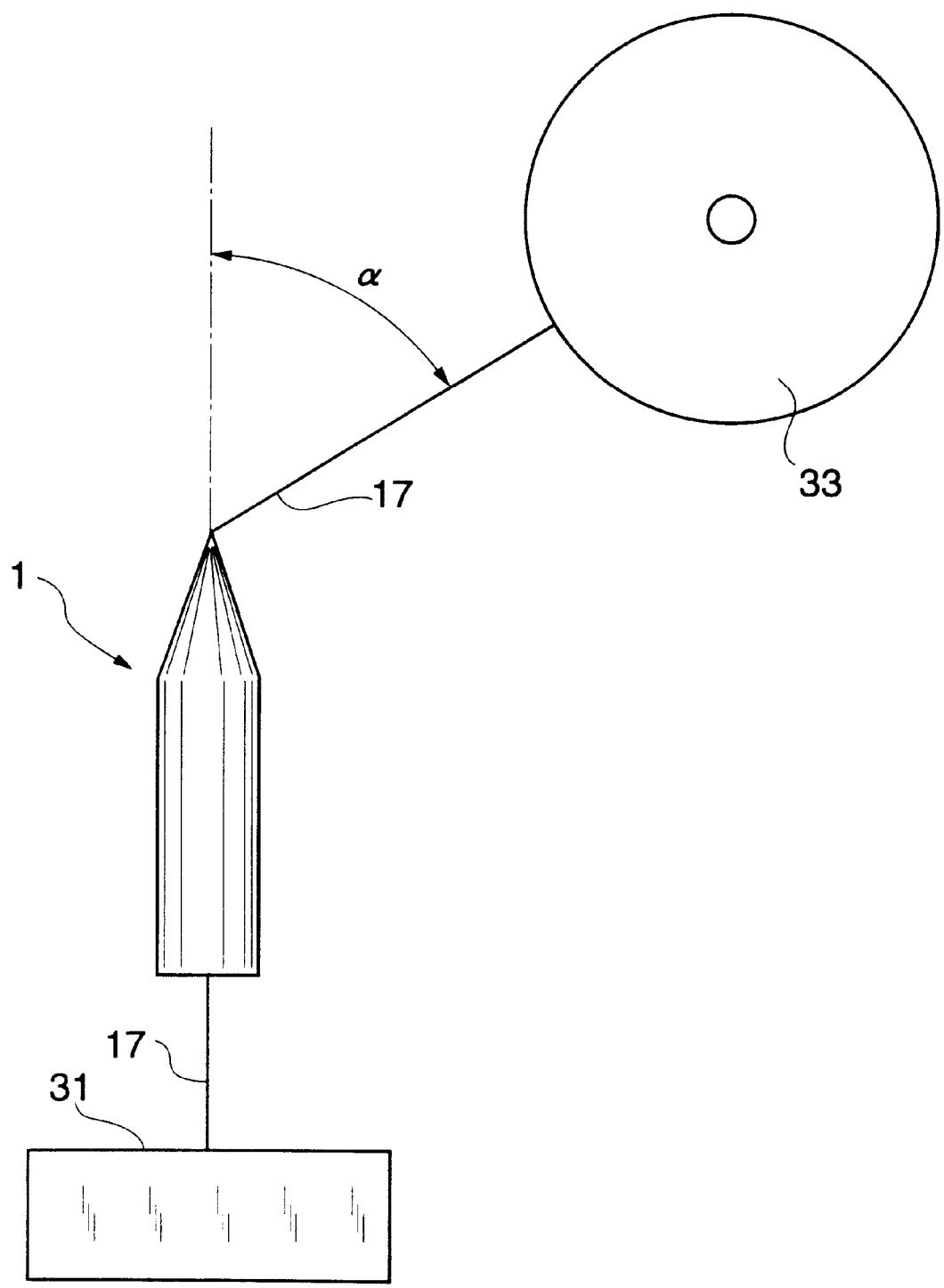
FIG. 2 shows a schematic view of an experiment for measurement of the extraction resistance of a wire, with the extraction angle of the wire being changed, in various wire bonding capillaries.

FIG. 2 shows a schematic view of an experiment for measurement of the extraction resistance of a wire, the extraction angle of the wire being changed, in various wire bonding capillaries.

The capillary 1 is set with its tip upward, and the wire 17 is inserted in the capillary. The wire 17 with 30 μm diameter is used.

At the bottom end of the wire 17, a 0.6 g weight 31 is suspended. The wire 17 is slantly fed from the tip of the capillary and coupled to a tension gauge 33 located at the tip end of the wire 17. In this state, an extraction resistance force is measured while the wire 17 is extracted at a constant speed( 0.3 mm/sec). Here, the experiment is carried out while the angle (the extraction angle α) between the axis of the capillary and the extracting direction of the wire 17 is changed to 30°, 60°, 75° and 90°.

Figure 3:
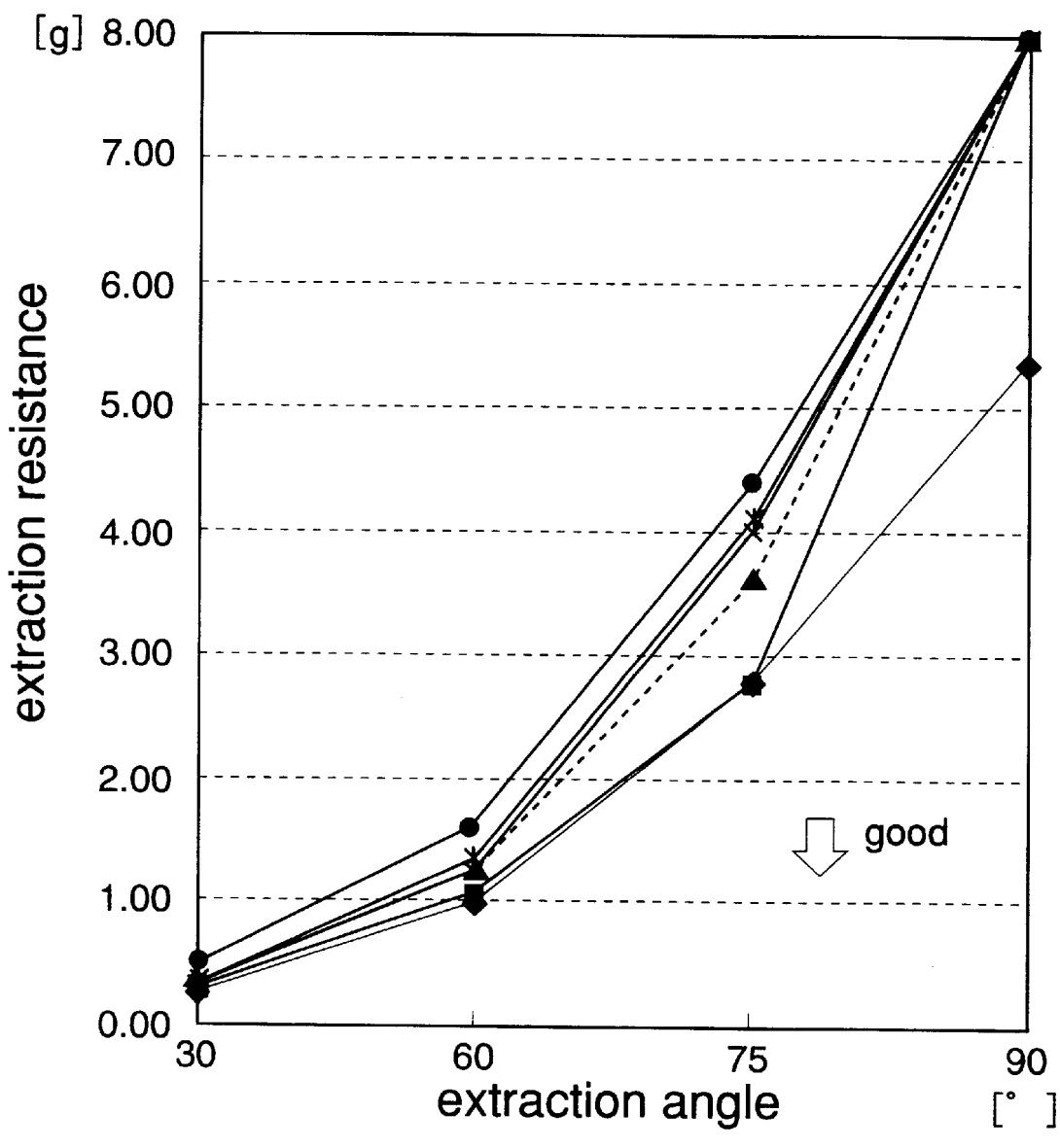
FIG. 3 shows a graph of a result of an experiment for measurement of the extraction resistance of the wire, with the bore length ratio to the through bore of the capillary and the extraction angle of the wire being changed. The abscissa shows the extraction angle and the ordinate shows the extraction resistance.

FIG. 3 shows a graph of a result of an experiment for measurement of the extraction resistance of a wire, with a value, (the bore length ratio to the through bore of the capillary), obtained by dividing the through bore length by the through bore diameter and an extraction angle of the wire being changed. The abscissa shows the extraction angle and the ordinate shows the extraction resistance. The bore length ratio is shown in various symbols in FIG. 3.

The chamfer of the capillary in this experiment has the opening angle θ1 of 45°, and the corner between the chamfer and the through bore is grounded.

Understood from FIG. 3, the extraction resistance suddenly rises when the extraction angle exceeds 60°. FIG. 3 clearly shows that the operation of long and low loop wire bonding causes the extraction angle to become large and then resistance of the capillary increases, so that the smoothness of feeding of the capillary is liable to be lost. As for the bore length ratio to the through bore, the extraction resistance will be lower when the ratio is lower. That is, because the extraction resistance at a narrow through bore is large, when the length of the through bore is shortened, the extraction resistance decreases. According to this Figure, the bore length ratio to the through bore is preferably not bigger than 1.5 at which the extraction angle is 75° and the extraction resistance is less than 4.0 g. The ratio is more preferably not bigger than 1.0 at which the extraction angle is 75° and the extraction resistance is less than 3.6 g. Further, the ratio is more preferably not bigger than 0.5 at which the extraction angle is 75° and the extraction resistance is less than 3.0 g. The lower limit of the bore length ratio to the through bore is preferably not smaller than 0.2 in view for preventing the eccentricity of a bonded ball.

Figure 4:
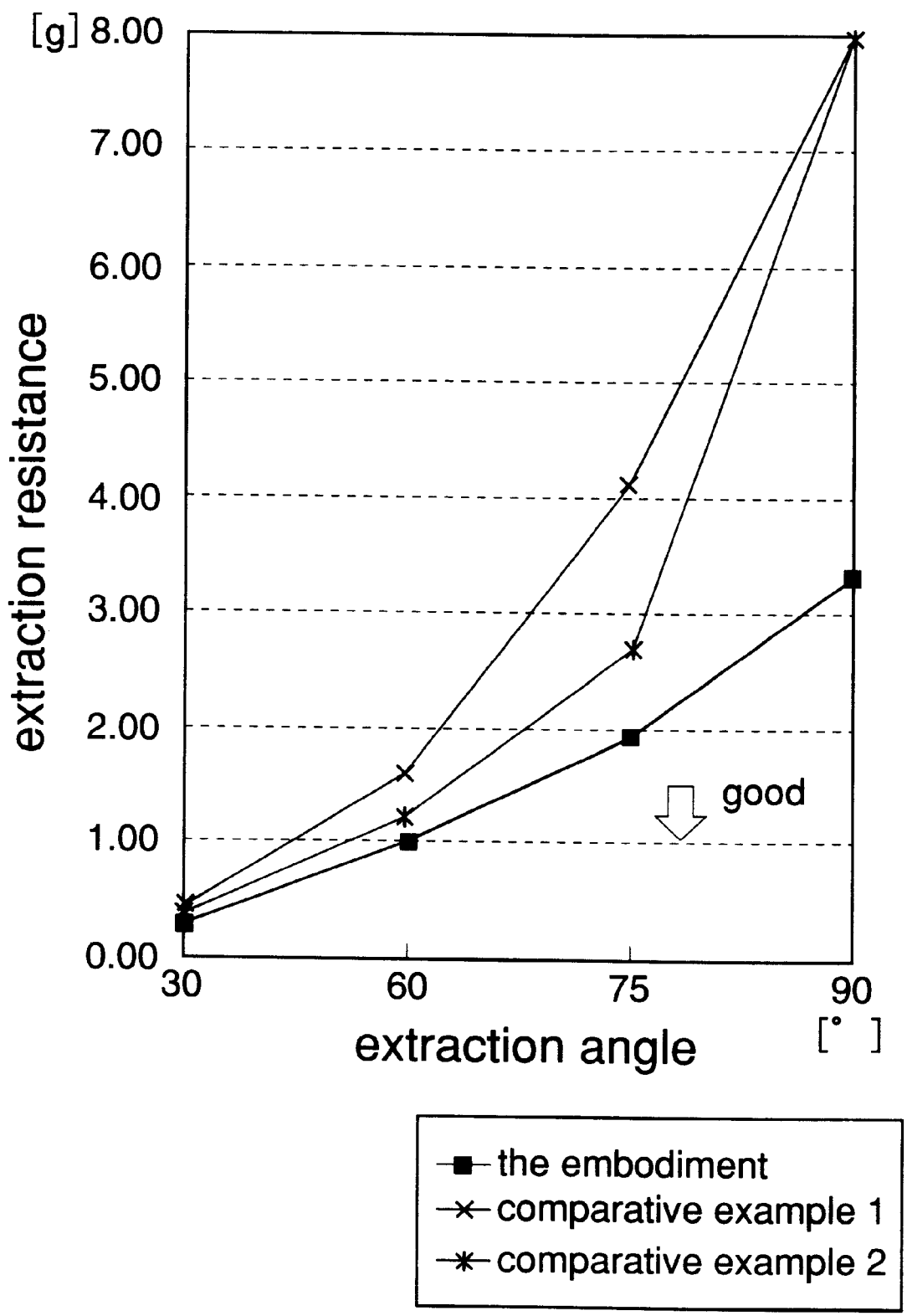
FIG. 4 shows a graph of a result of an experiment for measurement of the extraction resistance of the wire, with a shape of the chamfer and an extraction angle of the wire being changed. The abscissa shows the extraction angle and the ordinate shows the extraction resistance.

FIG. 4 is a graph showing a result of the extraction resistance measurement of a wire, while the shape of the chamfer and the extraction angle of the wire are changed. The abscissa shows the extraction angle and the ordinate shows the extraction resistance. The shapes of the chamfer are shown in various symbols in FIG. 4.

The capillary of the embodiment has two tapered portions( 15° and 45°) and the bore length ratio is 0.7. The capillary of the comparative example 1 has one tapered portion (45°) and the bore length ratio is 3.0. The capillary of the comparative example 2 has one tapered portion (45°) and the bore length ratio is 2.0.

As shown FIG. 4, in the embodiment, the extraction resistance is substantially low in comparison with the comparative examples 1 and 2. And, even when the extraction angle becomes 75° or 90°, the extraction resistance dose not greatly increase. On the other hand, in the comparative examples, the extraction resistance is not only large as a whole but also the extraction resistance greatly increases as the extraction angle increases. By this, it is understood that the tapered portion, from which the wire is fed, is formed to widen toward the exit so that the extraction resistance can decrease.

The following results are obtained from the experiments conducted.

θ1 is 40–60°, preferably about 45°;

θ2 is 10–25°, preferably about 15°;

the through bore diameter d1 is the wire diameter d plus (6–15) μm, preferably plus 12 μm;

the through bore length h2 is the through bore diameter d1×(0.2–1.5), preferably×0.7.

When the edges of the lower chamfer 9, the upper chamfer 7 and the boundary part of the through bore are slightly rounded, the best result will be obtained.

Next, materials and manufacturing methods, according to this embodiment, of the wire bonding capillary will be explained.

Material examples are alumina based ceramics, ruby and silicon nitride based ceramics.

Forming methods include a press molding, an isostatic molding and an injection molding method.

Polishing is an example of a through bore machining method.

Tapered portion machining methods include grinding and polishing.

What the wire bonding capillary according to the present embodiment is employed, in a case where the wire is fed to a slantly downward direction, the capillary acts as a guide so that the feeding of the wire can be smoothly carried out and wire bonding failures associated with a dispersion of the loop height can be diminished.

The present invention, as described above, provides a wire bonding capillary which is able to decrease wire extraction resistance and suitable for a long and low loop wire bonding process. Thus, the wire bonding capillary according to the present invention can be adapted for further high integration of the VLSI.

Various modifications and alteration can be made within the scope of the appended claims. Features of one embodiment can be combined with other embodiments, consistent with proper operation. While the principles of the invention have been described above in connection with specific apparatus, it is to be clearly understood that this description is made only by way of example and not as a limitation on the scope of the invention.

We claim:

1. A wire bonding capillary, comprising:

a through bore for feeding a bonding wire;

a funnel-shaped bore for guiding the wire to said through bore; and a chamfer formed at an exit of said through bore, wherein said through bore has a smallest diametered portion with a length less than 1.5 times its diameter.

2. The wire bonding capillary according to claim 1, wherein said length is more than 0.2 times said diameter.

3. The wire bonding capillary according to claim 1, wherein said chamfer is so formed to widen an opening angle thereof toward said exit of said through bore.

4. The wire bonding capillary according to claim 1, wherein said chamfer is tapered in two steps.

5. The wire bonding capillary according to claim 1, wherein:

said chamfer is tapered in two steps;

said first step has an opening angle of about between 10 and 25°; and said second step has an opening angle of about between 40 and 60°.

6. The wire bonding capillary according to claim 1, wherein:

said length is more than 0.2–1.5 times said diameter;

said chamfer is tapered in two steps;

said first step has an opening angle of about between 10 and 25°; and said second step has an opening angle of about between 40 and 60°.

7. The wire bonding capillary according to claim 1, wherein:

said diameter is the wire diameter plus 6–15 $\mu$m.

8. A wire bonding capillary, comprising:

a through bore for feeding a bonding wire;

a funnel-shaped bore for guiding the wire to said through bore; and a chamfer formed at an exit of said through bore, wherein said through bore has a smallest diametered portion with a length less than 1.0 times its diameter.

9. The wire bonding capillary according to claim 8, wherein said length is more than 0.2 times said diameter.

10. A wire bonding capillary according to claim 8, wherein said chamfer is so formed to widen an opening angle thereof toward said exit of said through bore.

11. The wire bonding capillary according to claim 8, wherein said chamfer is tapered in two steps.

12. The wire bonding capillary according to claim 8, wherein:

said chamfer is tapered in two steps;

said first step has an opening angle of about between 10 and 25°; and said second step has an opening angle of about between 40 and 60°.

13. The wire bonding capillary according to claim 8, wherein said diameter is the wire diameter plus 6–15 $\mu$m.

* * * * *

UNITED STATES PATENT AND TRADEMARK OFFICE
CERTIFICATE OF CORRECTION

PATENT NO. : 6,325,269 B1
DATED : December 4, 2001
INVENTOR(S) : Suzuki et al.

It is certified that error appears in the above-identified patent and that said Letters Patent is hereby corrected as shown below:

<u>Title page,</u>
Item [73], should read:
-- [73] Assignee: Toto Ltd., Fukuoka (JP)
 and Kabushiki Kaisha Shinkawa, Tokyo (JP) --

Signed and Sealed this

Eighth Day of October, 2002

*Attest:*

*Attesting Officer*

JAMES E. ROGAN
*Director of the United States Patent and Trademark Office*